US007368908B2

(12) United States Patent
Yamada

(10) Patent No.: US 7,368,908 B2
(45) Date of Patent: May 6, 2008

(54) MAGNETIC ELEMENT

(75) Inventor: Satoru Yamada, Tokyo (JP)

(73) Assignee: Sumida Corporation (JP)

( * ) Notice: Subject to any disclaimer, the term of this patent is extended or adjusted under 35 U.S.C. 154(b) by 0 days.

(21) Appl. No.: 11/460,110

(22) Filed: Jul. 26, 2006

(65) Prior Publication Data

US 2007/0024279 A1 Feb. 1, 2007

(30) Foreign Application Priority Data

Jul. 26, 2005 (JP) ............................ 2005-216363

(51) Int. Cl.
*G01R 33/02* (2006.01)

(52) U.S. Cl. ....................... 324/244; 324/249; 324/258

(58) Field of Classification Search ................ 324/244, 324/249, 252, 253, 258, 260, 262
See application file for complete search history.

(56) References Cited

U.S. PATENT DOCUMENTS 2,568,169 A 9/1951 Raczynski
3,305,814 A * 2/1967 Moyer ........................ 336/200
3,413,716 A * 12/1968 Schwertz et al. .......... 29/602.1
3,614,554 A * 10/1971 Shield et al. ............... 257/531
3,858,138 A * 12/1974 Gittleman et al. .......... 336/136
5,392,020 A 2/1995 Chang
5,576,680 A * 11/1996 Ling .......................... 336/200
6,367,143 B1 * 4/2002 Sugimura .................. 29/602.1
2005/0122200 A1 6/2005 Shafer et al.

FOREIGN PATENT DOCUMENTS

EP 58-137206 8/1983
EP 942 441 A2 9/1999
JP 2005-109181 4/2005

* cited by examiner

*Primary Examiner*—Jay M Patidar
(74) *Attorney, Agent, or Firm*—von Simson & Chin, LLP; Stephen Chin

(57) ABSTRACT

A magnetic element in a flat-plate shape includes a linearly-extending first flat plate being made of one of a magnetic material and a conductive material and a helical second flat plate being made of the other of the magnetic material and the conductive material, and the first flat plate is inserted into the helical structure of the second flat plate so as to alternatively weave front and back surfaces of the second flat plate.

8 Claims, 7 Drawing Sheets

MAGNETIC ELEMENT

CROSS-REFERENCE TO RELATED APPLICATION

This application claims priority to Japanese Patent Application No. 2005-216363 filed on Jul. 26, 2005, the entire disclosure of which is hereby incorporated by reference.

BACKGROUND OF THE INVENTION

1. Field of the Invention

The present invention relates to a magnetic element.

2. Description of the Related Art

A typical structure of a conventionally-known magnetic element is a wound structure with a conductive wire being wound around the outer circumference of a columnar core material made of a magnetic material, as disclosed in, for example, Japanese Patent Application Laid-Open No. 2005-109181.

Meanwhile, the core material needs a certain degree of thickness from the stand point of improvement of workability when winding the conductive wire. For this reason, there is a problem in that the thickness of the magnetic element becomes large and therefore it is difficult to secure an arrangement space when the magnetic element is arranged in electric appliances.

SUMMARY OF THE INVENTION

The present invention has been made in view of the above-described circumstance, and an object of the present invention is to provide a magnetic element an arrangement space of which can be reduced.

In order to solve the above-mentioned problem, according to one aspect of the present invention, there is provided a magnetic element in a flat-plate shape, including: a linearly-extending first flat plate being made of one of a magnetic material and a conductive material; and a helical second flat plate being made of the other of the magnetic material and the conductive material, wherein the first flat plate is inserted into the helical structure of the second flat plate so as to alternatively weave front and back surfaces of the second flat plate. According to such a configuration, both the first flat plate and the second flat plate present in a flat-plate shape and therefore the magnetic element can be formed to be thin.

Furthermore, according to another aspect of the present invention, the first flat plate and the second flat plate have flexibility. According to such a configuration, the whole magnetic element has flexibility.

Furthermore, according to still another aspect of the present invention, the second flat plate has the surface thereof coated with an insulation film. Such a configuration can reduce a risk in which any portion of the helical structure of the second flat plate is short-circuited.

Furthermore, according to still another aspect of the present invention, the magnetic element is made of the magnetic material formed by combining magnetic material powders with a resin material.

Furthermore, according to still another aspect of the present invention, the magnetic element includes the second flat plate that is alternatively slit from right and left sides in the width direction. Therefore, the first flat plate is inserted so that the slit portions of the second flat plate are sewn, whereby the magnetic element can be easily manufactured.

Furthermore, according to still another aspect of the present invention, there is provided the magnetic element in which both ends of the magnetic material are connected to constitute a closed magnetic path.

According to the present invention, an arrangement space of a magnetic element can be reduced.

DETAILED DESCRIPTION OF THE PREFERRED EMBODIMENTS

Figure 1:
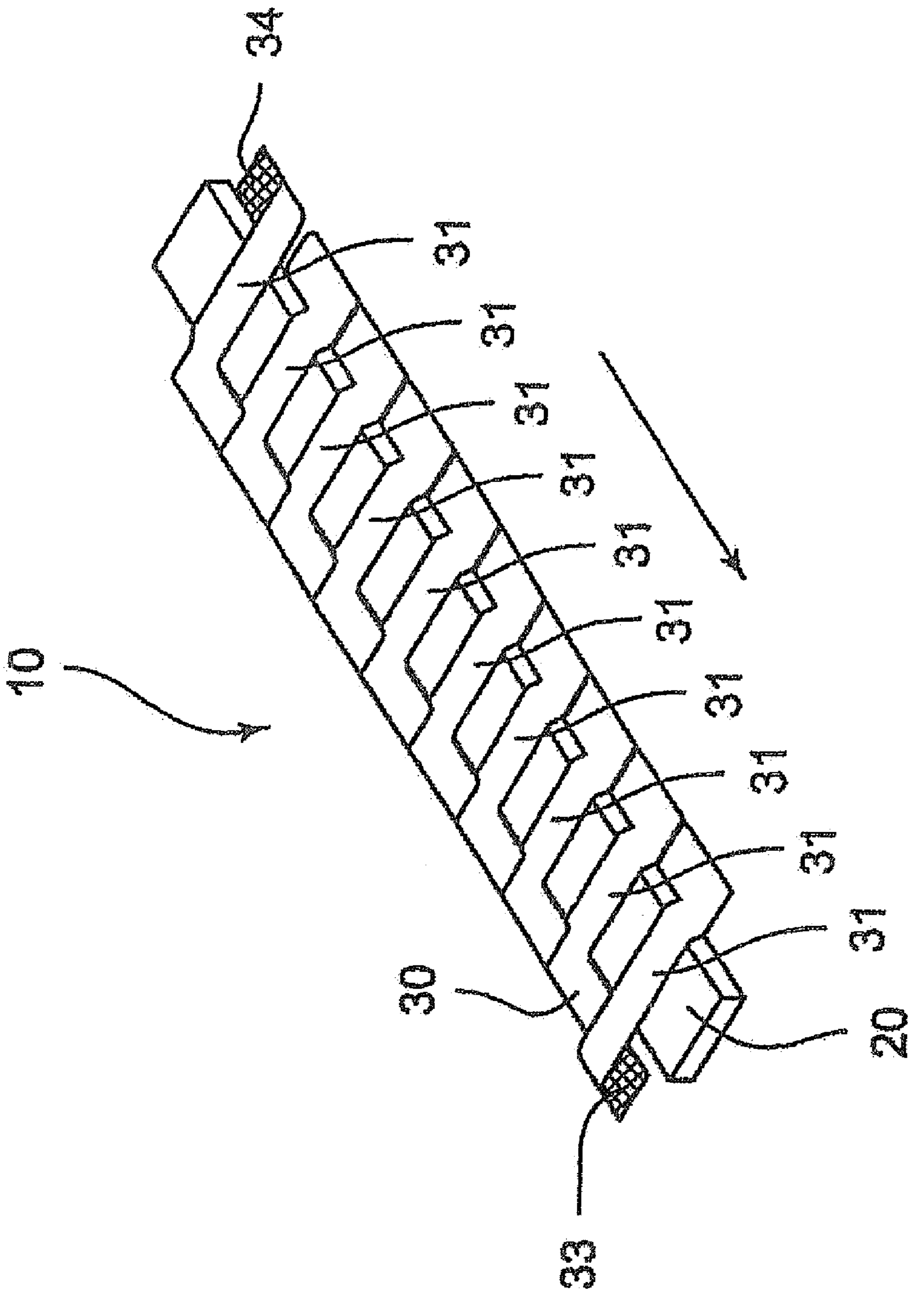
FIG. 1 is a perspective view showing the entire configuration of a magnetic element according to an embodiment of the present invention.
Figure 2:
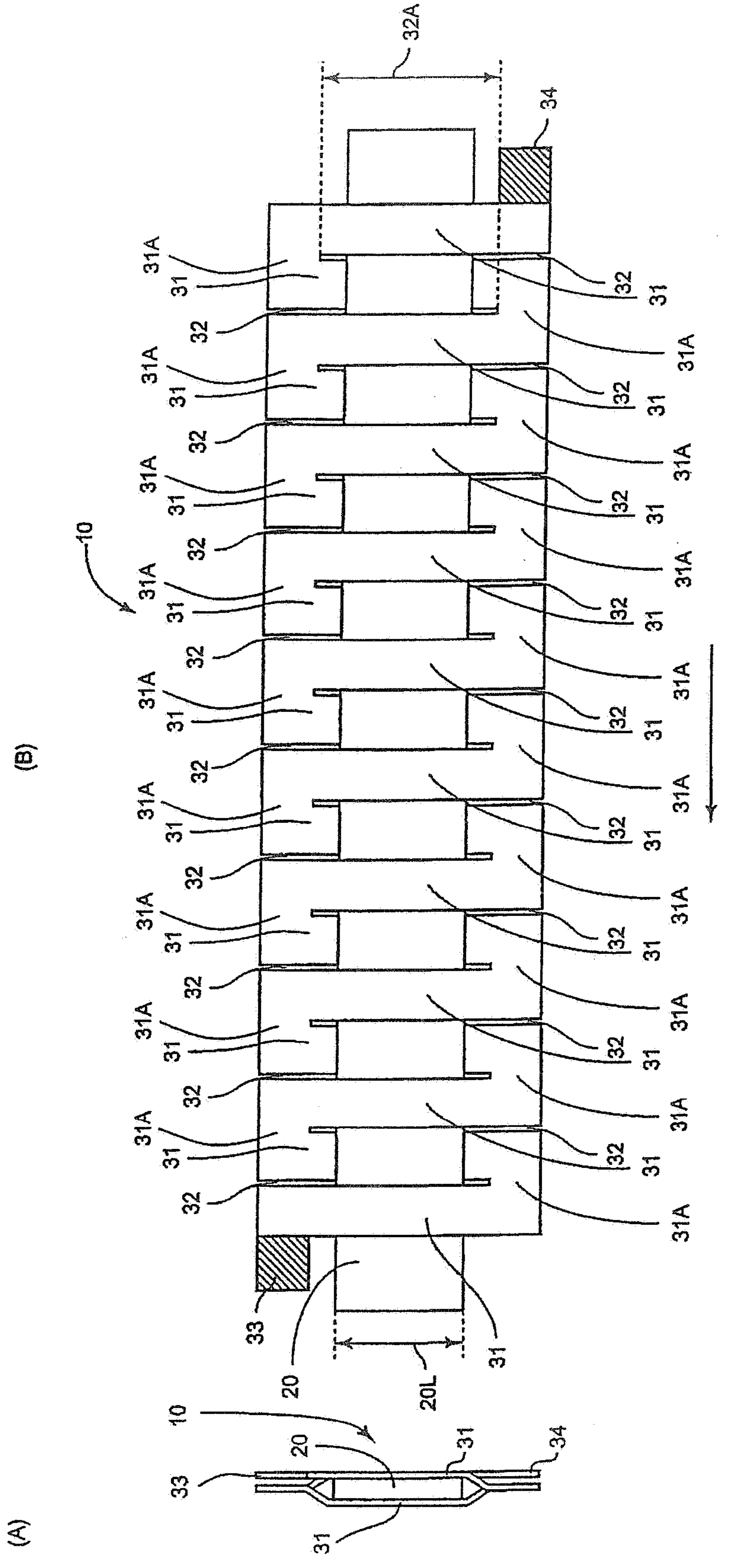
FIG. 2A and FIG. 2B are a front view and a plan view of the magnetic element according to the embodiment of the present invention.

A magnetic element according to an embodiment of the present invention will be described below on the basis of FIG. 1 to FIG. 4. FIG. 1 is a perspective view showing the entire configuration of a magnetic element 10; FIG. 2A is a front view of the magnetic element 10; and FIG. 2B is a plan view of the magnetic element 10. Furthermore, FIG. 3 is a left side view of the magnetic element 10.

Figure 3:
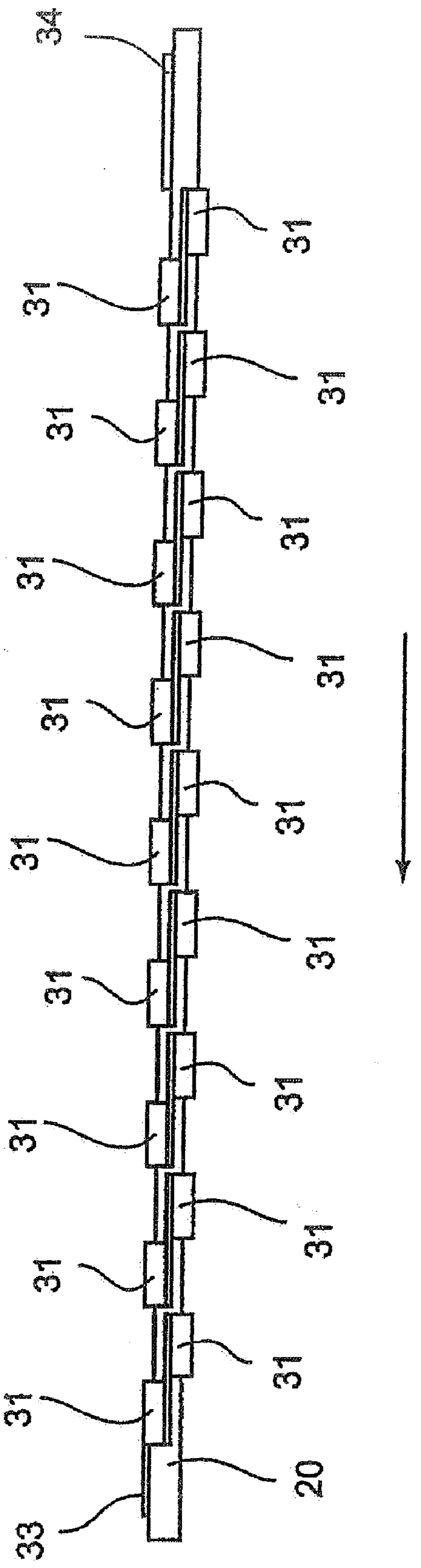
FIG. 3 is a left side view of the magnetic element according to the embodiment of the present invention.

As shown in FIG. 1 to FIG. 3, the magnetic element 10 has a magnetic material 20 as a first flat plate and a conductive material 30 as a second flat plate.

First, the magnetic material 20 will be described. The magnetic material 20 is formed by combining magnetic material powders such as ferrite and iron with a resin material such as polyethylene, unsaturated polyester, and epoxy as a binder, and is formed in a rectangular flat-plate shape. Since the magnetic material 20 is formed by combining the magnetic material powders with the resin material as the binder, it has flexibility and can be bent in the longitudinal and width directions.

Figure 4:
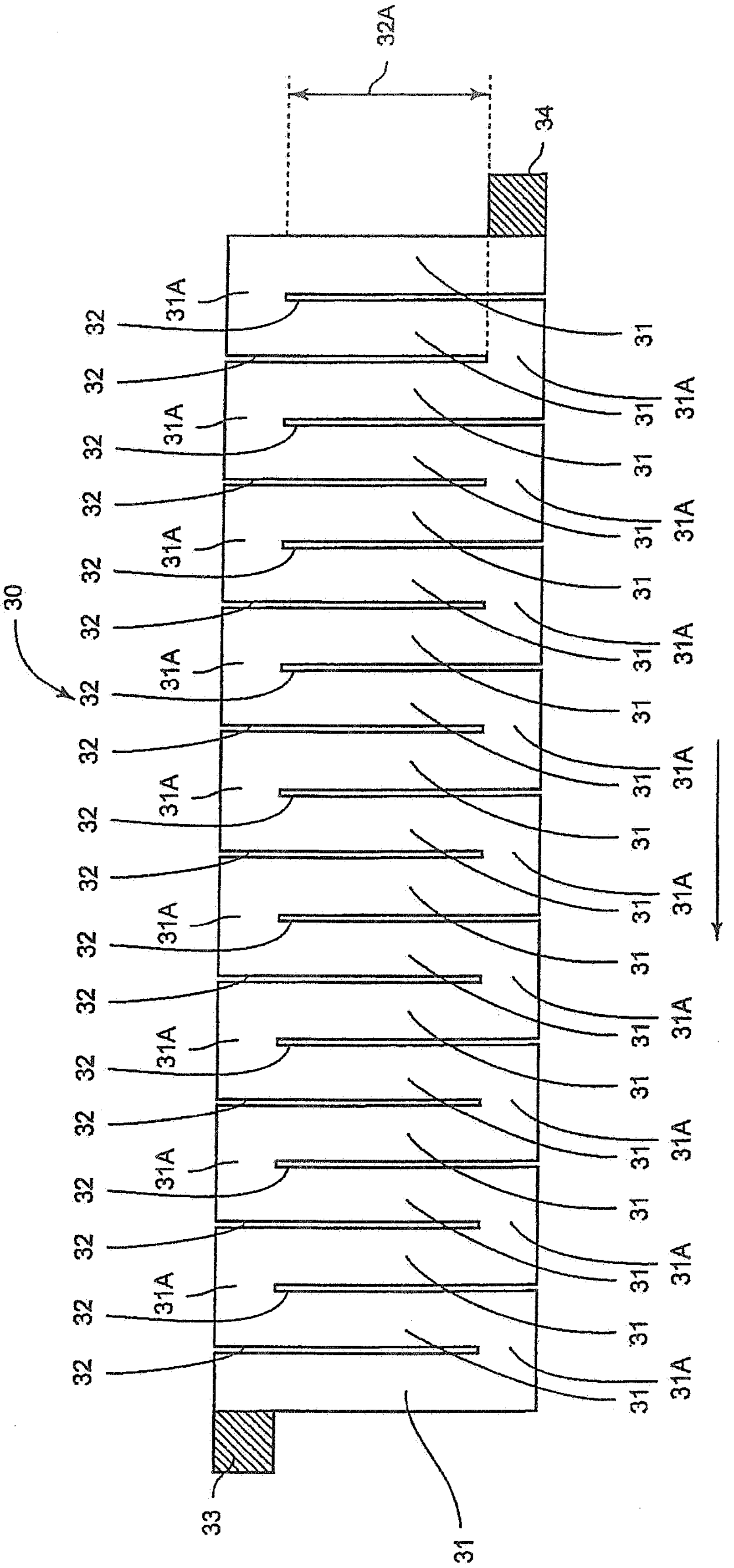
FIG. 4 is a plan view of a conductive material according to the embodiment of the present invention.

Next, the configuration of the conductive material 30 will be described with reference to FIG. 1 to FIG. 4. FIG. 4 is a plan view of the conductive material 30. In FIG. 1 to FIG. 4, the following will be described on the assumption that a direction shown by an arrow indicating a longitudinal direction of the magnetic material 20 is set as the front; a right side of the arrow direction is set as the right; and a left side of the arrow direction is set as the left.

The conductive material 30 has flexible, thin plate-like, and rectangular strip-shaped portions 31 which are connected by connection portions 31A to present in a plate-like, helical shape as a whole. Furthermore, the conductive material 30 is composed of a conductive material such as copper. Then, as shown in FIG. 1 to FIG. 3, the magnetic material 20 is inserted in the helical structure of the conductive material 30 so as to alternatively weave the front and back surfaces of the strip-shaped portions 31. More specifically, one of ends of each strip-shaped portion 31 is connected by the connection portion 31A to an adjacent strip-shaped portion 31, which is located in the front direction, on one side of the ends in the right-left direction, and the other of the ends of each strip-shaped portion 31 is connected by the connection portion 31A to an adjacent strip-shaped portion 31, which is located in the back direction, on the other side of the ends in the right-left direction. Therefore, the conductive material 30 has the connection portions 31A which serve as portions bent towards the right-left direction to present in a substantially zig-zag strip shape as a whole. Furthermore, a length of a portion 32A defined by overlapping, in the front-back direction, gap portions 32 with each other which are formed between the strip-shaped portions 31 arranged in parallel is formed to be wider than a width 20L of the magnetic material 20 in the right-left direction.

Furthermore, the strip-shaped portions 31 have flexibility and therefore the whole conductive material 30 also has flexibility. In addition, the surface of the conductive material 30 is coated with an insulation material such as enamel except for terminal portions 33 and 34 (portions shown by hatching in FIG. 1, FIG. 2, and FIG. 4) which are formed at both ends in the front-back direction.

The conductive material 30 is alternatively intersected with one surface and the other surface of the magnetic material 20, that is, the conductive material 30 is fitted so as to be intersected with respect to the magnetic material 20 at the front and back surfaces of the magnetic material 20. In other words, the magnetic material 20 passes through the portions 32A where the respective gap portions 32 overlap with each other in the front-back direction. In addition, the front surface of the drawing is set as the front surface of the magnetic material 20 and the back surface of the drawing is set as the back surface of the magnetic material 20 in FIG. 2; and in FIG. 1 and FIG. 3, the upper side of the drawing is set as the front surface of the magnetic material 20 and the lower side of the drawing is set as the back surface of the magnetic material 20. Therefore, the strip-shaped portions 31 intersecting with the magnetic material 20 in the conductive material 30 are alternately arranged on the front surface side of the magnetic material 20 and alternately arranged on the back surface side of the magnetic material 20, and consequently, the front and back surfaces of the magnetic material 20 are sandwiched by the strip-shaped portions 31. Thus, the conductive material 30 is fitted to the magnetic material 20, whereby it becomes the same configuration as that in which a conductive wire is wound around the magnetic material 20.

By the way, the conductive material 30 of the first embodiment is manufactured in the following manner, for example.

Figure 5:
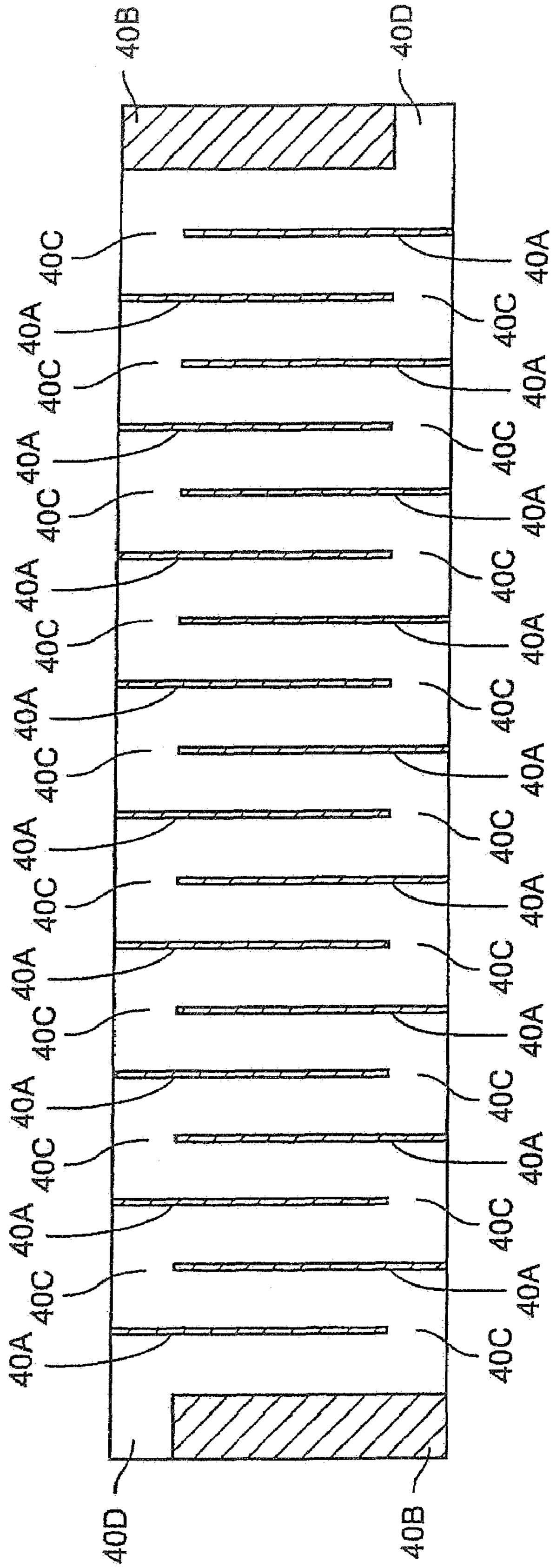
FIG. 5 is a view showing a manufacturing method of the conductive material according to the embodiment of the present invention.

First, with respect to a rectangular thin plate 40 made of copper as shown in FIG. 5, cutoff portions 40A and 40B shown by hatching are cut off by a punching process of a press, for example.

The cutoff portions 40A are formed as slit portions which are formed from one edge extending in the longitudinal direction of the thin plate 40 toward the other edge, however, a neighboring cutoff portion 40A is formed so that the slit direction thereof is oriented in the opposite direction and is provided so that connection portion 40C remains so as not to cut off the thin plate 40.

Each of the cutoff portions 40B is provided at both ends in the longitudinal direction of the thin plate 40 so that each of remaining portions 40D remains on the side from which the thin plate 40 is slit to form the neighboring cutoff portion 40A.

As described above, by providing the cutoff portions 40A, cutoff portions 40B, connection portions 40C, and remaining portions 40D, portions obtained by cutting off the cutoff portions 40A from the thin plate 40 are formed as the gap portions 32. Furthermore, the connection portions 40C serve as the connection portions 31A. Further, the remaining portions 40D are formed as the terminal portions 33 and 34.

The conductive material 30 thus punched out from the thin plate 40 is subjected to an insulation coating process by a method in which it is soaked in a tub filled with an insulation coating material such as enamel liquid or the like. The cutoff portion 40A is not shaped in such a manner that both sides of the slit portion come in contact with each other as in the case of being slit by scissors, for example, but is shaped with some widths being provided therebetween. Therefore, when the insulation coating process is performed, edge portions of the slit sides of the strip-shaped portions 31 are also completely coated with an insulation material. As for the terminal portions 33 and 34, the enamel coating is scaled off to expose the conductive material.

As described above, the magnetic material 20 is a linear flat plate and the conductive material 30 is a helical flat plate, and therefore, the magnetic element 10 is thinly formed as a whole. Therefore, when the magnetic element 10 is arranged in electric appliances and the like, limitation of arrangement space within the device is alleviated. Additionally, in this embodiment, both the magnetic material 20 and the conductive material 30 have flexibility and therefore the magnetic element 10 also has flexibility as a whole. Accordingly, the magnetic element 10 can be arranged along a shape such as an arrangement space or the like within the device and therefore limitation to the arrangement space or the like of the magnetic element 10 can be further alleviated.

Furthermore, since the conductive material 30 is fitted to the magnetic material 20 only by passing the magnetic material 20 through the gap portions 32; when manufacturing the magnetic element, a manufacturing step of the magnetic element can be simplified, as compared with a work that a conductive wire is wound around the magnetic material.

In addition, when the number of the cutoff portions 40A increases, the number of the strip-shaped portions 31 per length of the magnetic material 20, that is, the number of the strip-shaped portions 31 intersecting with the magnetic material 20 increases. On the other hand, when the number of the slit portions decreases, the number of the strip-shaped portions 31 per length of the magnetic material 20 decreases. Therefore, the number of the cutoff portions 40A is suitably set and the number of the strip-shaped portions 31 per length of the magnetic material 20 is set, whereby an inductance value or the like of the magnetic element 10 can be suitably set. Furthermore, a sectional area or composition of the magnetic element 10 is suitably changed and an inductance value or the like can be also suitably set.

In addition, in this embodiment, both the magnetic material 20 serving as the first flat plate and the conductive material 30 serving as the second flat plate are allowed to have flexibility so that the magnetic element 10 has flexibility as a whole, however, it is sufficient if at least one of them has flexibility. This is because if none of them has flexibility, the strip-shaped portions 31 cannot be alternatively arranged on the front and back surfaces of the magnetic material 20 while sandwiching the thickness of the magnetic material 20. In other words, the magnetic material 20 or the strip-shaped portions 31 are bent by as much as the thickness of the magnetic material 20, and as a result, the strip-shaped portions can be alternatively arranged on the front and back surfaces of the magnetic material 20.

Furthermore, in this embodiment, the first flat plate is made of a magnetic material and the second flat plate is made of a conductive material, however, the first flat plate may be made of a conductive material and the second flat plate may be made of a magnetic material in an adverse manner.

The magnetic element 10 thus configured is formed with the thickness thereof being thin and therefore it can be sewn into fabrics such as clothes. Furthermore, the flexibility of the magnetic element 10 allows for a minimum degree of deterioration in flexibility of fabric at a portion where the magnetic element 10 is sewn.

Figure 7:
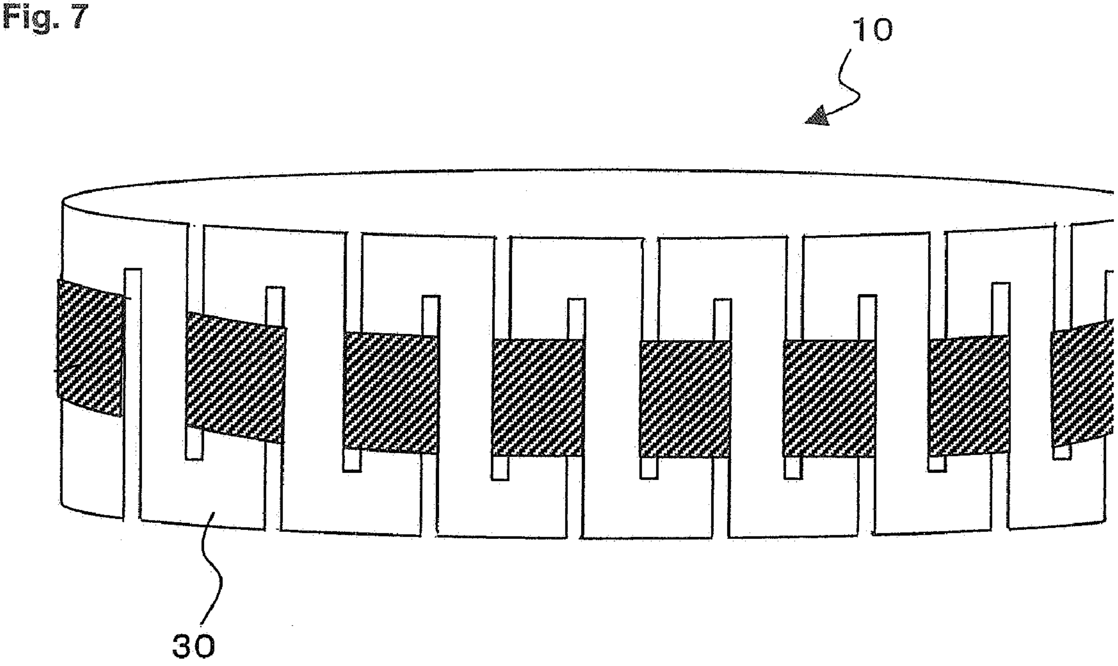
FIG. 7 is a modification example of the magnetic element of the present invention and a view showing the magnetic element in which a closed magnetic path is formed by connecting both ends of a magnetic material.

Furthermore, as shown in FIG. 7, if the both ends of the magnetic material 20 are short-circuited or magnetically connected by U-shaped magnetic material 20, a closed magnetic path is formed. For example, another magnetic material 20 having the same shape as the magnetic material 20 is overlapped from above the strip-shaped portions of the conductive material 30, and if the both ends of the overlapping magnetic material 20 and the overlapped magnetic material 20 are connected, a thin magnetic element 10 forming a closed magnetic path can be constituted. The portion of the magnetic material 20 is shown by hatching in FIG. 7. Furthermore, the details of the backside with respect to the drawing in FIG. 7 are omitted.

Figure 6A:
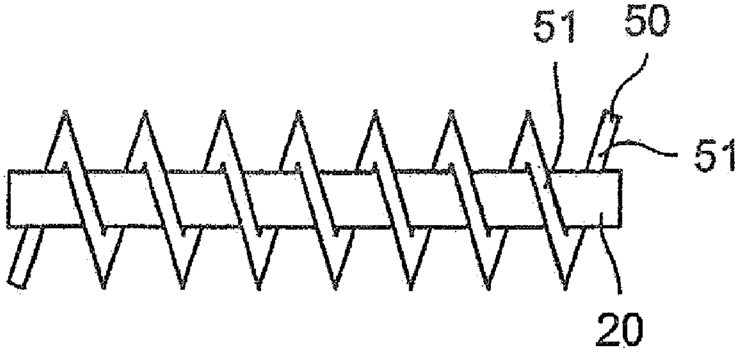
FIG. 6A and FIG. 6B are front views, each showing a magnetic element according to a modification example of the present invention.
Figure 6B:
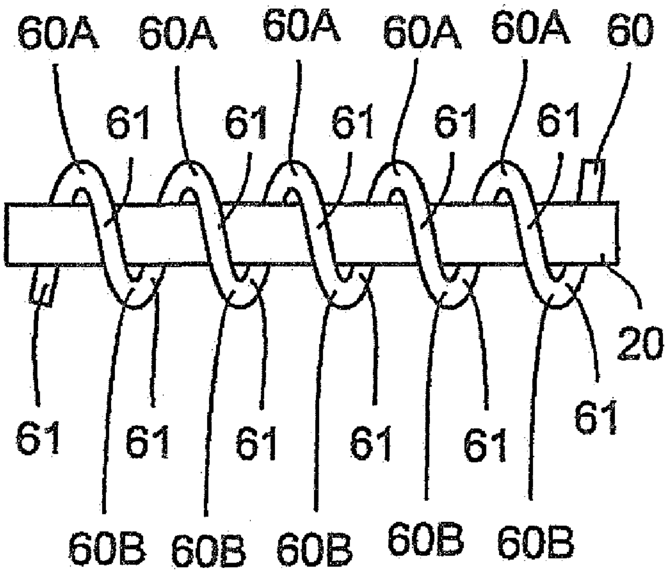

Furthermore, the conductive material 30 may be formed to be a serration-type conductive material 50 in a zig-zag shape or a wave-type conductive material 60 in a zig-zag shape, as shown in FIGS. 6A and 6B, respectively. It should be noted that in the conductive material 50, straight portions 51 correspond to the strip-shaped portions 31 of the conductive material 30 shown in FIG. 1 to FIG. 5. Furthermore, in the conductive material 60, curved portions 61 connecting peak portions 60A and bottom portions 60B of the wave correspond to the strip-shaped portions 31 of the conductive material 30 shown in FIG. 1 to FIG. 5.

The magnetic element according to the present invention can be used in the field of magnetic elements such as inductors and antennas for use in RFID (Radio Frequency Identification).

What is claimed is:

1. A magnetic element in a flat-plate shape, comprising:

a linearly-extending first flat plate being made of one of a magnetic material and a conductive material; and a helical second flat plate being made of the other of the magnetic material and the conductive material, said helical second flat plate being a unitary body wherein cuts have been alternatively made on the right and left sides in the width direction to create alternating slits in the unitary body, wherein the first flat plate is inserted into the slits of the helical second flat plate so as to alternatively weave front and back surfaces of the second flat plate, and said second flat plate is fitted so as to be intersected with respect to the first flat plate at the front and back surfaces.

2. The magnetic element according to claim 1, wherein the first flat plate and the second flat plate have flexibility.

3. The magnetic element according to claim 2, wherein the surface of the flat plate being made of the conductive material is coated with an insulation film.

4. The magnetic element according to claim 2, wherein the magnetic material is formed by combining magnetic material powders with a resin material.

5. The magnetic element according to claim 2, wherein the magnetic material has both ends thereof connected to constitute a closed magnetic path.

6. The magnetic element according to claim 1, herein the surface of the flat plate being made of the conductive material is coated with an insulation film.

7. The magnetic element according to claim 1, wherein the magnetic material is formed by combining magnetic material powders with a resin material.

8. The magnetic element according to claim 1, wherein the magnetic material has both ends thereof connected to constitute a closed magnetic path.

* * * * *